United States Patent [19]

Fazekas et al.

[11] Patent Number: 4,471,302
[45] Date of Patent: Sep. 11, 1984

[54] METHOD FOR REPRESENTING LOGICAL STATUS CHANGES OF A PLURALITY OF ADJACENT CIRCUIT NODES IN AN INTEGRATED CIRCUIT IN A LOGIC IMAGE EMPLOYING A PULSED ELECTRON PROBE

[75] Inventors: Peter Fazekas; Hans-Peter Feuerbaum; Ulrich Knauer, all of Munich; Johann Otto, Bad Toelz, all of Fed. Rep. of Germany

[73] Assignee: Siemens Aktiengesellschaft, Berlin & Munich, Fed. Rep. of Germany

[21] Appl. No.: 341,106

[22] Filed: Jan. 20, 1982

[30] Foreign Application Priority Data

Mar. 16, 1981 [DE] Fed. Rep. of Germany ....... 3110138

[51] Int. Cl.³ ..................... G01R 31/00; G01N 23/00; G06F 11/32
[52] U.S. Cl. ................................ 324/158 R; 250/310; 324/73 R; 371/15
[58] Field of Search ............ 324/158 D, 158 R, 73 R; 250/310; 371/15, 21, 25

[56] References Cited

U.S. PATENT DOCUMENTS

| | | | |
|---|---|---|---|
| 4,220,853 | 9/1980 | Feuerbaum et al. | 250/310 |
| 4,220,854 | 9/1980 | Feuerbaum | 250/310 |
| 4,223,220 | 9/1980 | Feuerbaum | 250/310 |
| 4,277,679 | 7/1981 | Feuerbaum | 250/310 |

Primary Examiner—Ernest F. Karlsen
Attorney, Agent, or Firm—Hill, Van Santen, Steadman & Simpson

[57] ABSTRACT

A method for representing logic changes of state occurring at a plurality of adjacent circuit nodes in an integrated circuit in the form of a logic image employs a pulsed electron probe which always scans a same path in the x-direction on the integrated circuit and the phase of the electron pulses comprising the pulsed electron probe is continuously shifted for each new scanning operation. The integrated circuit can be imaged up to the edge of a recording or field of view limit and it is only at this limit that the y-deflection of the pulsed electron probe is fixed. Very small spacings, such as those occurring between adjacent integrated circuit tracks, can thus be reliably imaged on the picture screen of the scanning electron microscope.

3 Claims, 1 Drawing Figure

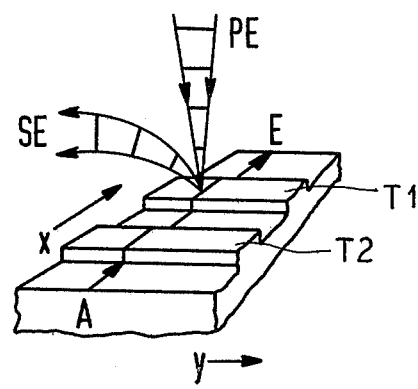

METHOD FOR REPRESENTING LOGICAL STATUS CHANGES OF A PLURALITY OF ADJACENT CIRCUIT NODES IN AN INTEGRATED CIRCUIT IN A LOGIC IMAGE EMPLOYING A PULSED ELECTRON PROBE

BACKGROUND OF THE INVENTION

1. Field of the Invention

The present invention relates to a method for representing logic changes of state of a plurality of adjacent circuit nodes in an integrated circuit, and in particular to such a method whereby such changes of state can be represented in a logic image by the use of a pulsed electron probe of a scanning electron microscope.

2. Description of the Prior Art

Circuit analysis and testing during the development phase of microprocessors and microcomputers with increasingly high data capacities requires testing methods and apparatus which can accommodate the increasingly complex and crowded conductor tracks which are present on the integrated circuits employed in such devices. In particular, conventional test technology cannot reliably produce an image for representing the changing logical status of closely adjacent tracks.

The concept of examination and testing of complex integrated circuits by the use of a scanning electron microscope is known to those skilled in the relevant technology. The concept of stroboscopic voltage coding is described, for example, in the article "Beiträge zu Fortschritten in der Elektronenstrahlmesstechnik," Feuerbaum, Beiträge elektronenmikroskopischer Direktabbildung Oberflächen 11, pages 67–71, 1978 and the concept of logic state mapping is described, for example, in the articles "Electron Beam Testing of Microprocessors" Chrichton et al, Digest of Papers, 1980 IEEE Test Conference, pages 444–449, 1980 and "Elektronenstrahl prüft elektrische Potentiale in integrierten Schaltungen," Fazekas, Technisches Messen, 48 1981 1, pages 29–35. These known techniques permit a simultaneous imaging of logical status changes at longer tracks which proceed parallel to one another. The methods and techniques described in these articles cannot, however, be applied for checking of short track sections. Logic status changes at such short track sections must be individually measured track-by-track either with mechanical test probes or with the electron probe. A simultaneous measurement of the status changes at short tracks is, however, difficult if not impossible to achieve with mechanical test probes.

SUMMARY OF THE INVENTION

It is an object of the present invention to provide a method for representing logical status changes at a plurality of adjacent circuit nodes in an integrated circuit in a logic image by means of a pulsed electron probe in a scanning electron microscope which can be applied to imaging the changes of state of short track sections disposed in a straight line.

The above object is inventively achieved in a method wherein the pulsed electron probe of the scanning electron microscope always scans the same path in the x-direction on the integrated circuit, and wherein the phase of the electron pulses of the electron probe is continuously shifted at the beginning of each new scanning operation in the x-direction.

In order to determine the time range to be imaged in the logic image representing the status changes, the phase range of an image pass is freely selected.

In order to orient the logic image with the test specimen, the specimen can be imaged on the picture screen of the scanning electron microscope up to a recording or field of view limiting line, and the y-deflection of the pulsed electron probe is fixed only at this line. This results in an image on the upper part of the picture screen of the scanning electron microscope showing a section of the integrated circuit, and an image on the lower part of the picture screen adjacent thereto showing a bar representation of the logical states of the most recently imaged line of the integrated circuit. The bars generated by the voltage contrast associated with the different logic states serves as a recording of the logical status changes at the plurality of adjacent circuit nodes under inspection.

The informational content of the representation of the logic status changes at the adjacent circuit nodes in the integrated circuits in the logic image generated in accordance with the inventive method corresponds to that of a conventional logic analyzer as is employed for testing microcomputers and computers, such as is described in the article "Logic Analyzers-Sharp Fault-Finders Getting Sharper" McLeod, Electronic Design 28 (1980) 7, pages 48–46.

DESCRIPTION OF THE DRAWING

The single FIGURE is a greatly enlarged perspective view of a portion of an integrated circuit under inspection according to the principles of the method disclosed and claimed herein having two closely adjacent conductor tracks.

DESCRIPTION OF THE PREFERRED EMBODIMENTS

The method disclosed and claimed herein is an improvement over conventional means for generating a logic image for which experimental investigations were undertaken on an unpassivated 8085 microprocessor which was developed and manufactured in a condensed version at Siemens AG, assignee of the subject matter of the present application.

The principle for producing a logic image is based on the sampling principle, described in the article "Quantitative Voltage Contrast at High Frequencies in the SEM," L. Balk et al, SEM/1976, pages 615–624. In electron beam technology, this means that the electron probe is pulsed at the frequency of the program lop and the phase is shifted over the entire loop or portions thereof. The program loops are preferably thus as short as possible, because the pulse-to-pulse ratio cannot fall below a minimum value and still obtain reliable results with the sampling techniques. This phenomenon is described in the article "Estimate of Minimum Measureable Voltage in the SEM," A. Gopinath, J. Phys. E: Sci. Instrum., Vol. 10, pages 911–913 (1977). The drawing is a schematic representation of the manner in which a logic image arises in accordance with the method disclosed and claimed herein. The pulsed electron probe from the scanning electron microscope slowly scans the tracks in the x-direction beginning at A. Although many such closely adjacent tracks may be present in practice, only two of such tracks T2 and T1 are shown in the drawing. When the beam arrives at the line end E, the beam skips back to the line beginning A and the operation begins anew. Each movement of the beam from A to E is defined as a line scan. The end of the scan E may be a limit of the field of view of the electron microscope or any other selected known limit. The primary or pulsed electron beam is referenced in the drawing at PE, and the secondary or reflected beam is referenced at SE.

While the pulsed electron probe always scans the same path in the x-direction on the integrated circuit, the electron beam at the picture screen of the scanning electron microscope scans the picture screen line-by-line, so that a surface image arises on the picture screen. Simultaneously with the line feed in the y-direction of the picture screen, the phase of the electron pulses which slowly scan the tracks in the x-direction is continuously shifted. Because of the freely selectable phase range during an image pass, either the entire program loop, or selected portions thereof, can be represented in the logic image. The image of the logical states is undertaken by means of the potential contrast, a logical "0" appearing bright and a logical "1" appearing dark, as is described in the article "Voltage Contrast—A Review," A. Gopinath at al, SEM/1978, pages 375–380 and the article "Qualitative and Quantitative Voltage Measurement on Integrated Circuits," Feuerbaum et al, Beiträge elektronenmikroskopisher Direktabbildung Oberflächen 11, Vol. 8, pages 469–480, 1975.

Measurements undertaken in accordance with the method disclosed and claimed herein on the unpassivated 8085 microprocessor precisely reproduce the input program loops. As is known to those skilled in the relevant technology, the use of a logic analyzer for testing computer systems with large data capacities is a significant aid to analysis of the circuits under investigation. This circuit testing technique can now be utilized to checked integrated circuits to obtain logic images thereof by the use of a pulsed electron probe even for those circuits and those portions of circuits which exhibit short track sections. Weaknesses and faults in microprocessors and microcomputers which could not previously be detected with conventional means can be successfully eliminated by the use of the method disclosed and claimed herein.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for representing logical status changes occurring at predetermined potential changes of adjacent circuit nodes of an integrated circuit in a logic image comprising the steps of:

scanning said circuit nodes on said integrated circuit in the x-direction with a pulsed electron probe of a scanning electron microscope, pulsed at the frequency of the potential changes of the integrated circuit, along the same path in the x-direction of the integrated circuit from a line scan beginning to a line scan end to produce secondary electrons at the nodes representing test values;

continuously shifting the phase of said electron pulses at a beginning of each new line scan over at least a portion of the cycle of the potential change;

sensing the secondary electrons and generating corresponding test value signals; and scanning the picture tube of the electron microscope in the y-direction and generating an image under the control of the test value signals.

2. The method of claim 1 wherein the step of continuously shifting said electron pulses is further defined by selecting a range over which said pulses are shifted corresponding to the time range to be imaged in the logic image.

3. The method of claim 1 comprising the additional step of imaging said circuit nodes of said integrated circuits up to said scanning line end and fixing the y-deflection of said pulsed electron probe only at said line end.

* * * * *